US010224911B1

(12) United States Patent
Tan et al.

(10) Patent No.: US 10,224,911 B1
(45) Date of Patent: Mar. 5, 2019

(54) DUAL SIGNAL PROTOCOL INPUT/OUTPUT (I/O) BUFFER CIRCUIT

(71) Applicant: Altera Corporation, San Jose, CA (US)

(72) Inventors: Tat Hin Tan, Bayan Lepas (MY); Choong Kit Wong, Bayan Lepas (MY); Ker Yon Lau, Pearl Island (MY); Hsiao Wei Su, Bayan Lepas (MY); Hoong Chin Ng, Sungai Petani (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/086,887

(22) Filed: Mar. 31, 2016

(51) Int. Cl.
*H03K 5/007* (2006.01)

(52) U.S. Cl.
CPC .................... *H03K 5/007* (2013.01)

(58) Field of Classification Search
None
See application file for complete search history.

(56) References Cited

U.S. PATENT DOCUMENTS

| | | | |
|---|---|---|---|
| 4,988,897 A * | 1/1991 | Jeong | H03K 19/018521 326/103 |
| 6,292,014 B1 * | 9/2001 | Hedberg | H04L 25/0286 326/21 |
| 6,472,904 B2 | 10/2002 | Andrews et al. | |
| 6,480,026 B2 | 11/2002 | Andrews et al. | |
| 6,646,472 B1 * | 11/2003 | Trivedi | G06F 1/3203 326/119 |
| 6,744,294 B1 * | 6/2004 | Svensson | H03F 1/223 326/83 |
| 6,856,178 B1 * | 2/2005 | Narayan | H03K 19/018585 326/87 |
| 6,870,391 B1 * | 3/2005 | Sharpe-Geisler | H03K 19/018585 326/37 |
| 7,034,574 B1 | 4/2006 | Li | |
| 7,038,487 B2 * | 5/2006 | Ingino | H03K 19/018557 326/30 |
| 7,116,135 B2 | 10/2006 | Wang et al. | |
| 7,265,586 B1 * | 9/2007 | Zhou | H04L 25/0264 326/38 |
| 7,652,520 B2 * | 1/2010 | Gatta | H01L 27/0705 327/436 |

(Continued)

*Primary Examiner* — Thomas J. Hiltunen

(57) ABSTRACT

An integrated circuit (IC) device includes a first input/output (I/O) buffer circuit. The first input/output buffer circuit includes first and second groups of stacked transistors. The first group of stacked transistors transfer signals formatted in accordance with only one signal protocol from the group of signal protocols. The second group of stacked transistors transfers the signals formatted in accordance with more than one signal protocols. In addition, integrated circuit device also includes a second input/output buffer circuit. The second input/output buffer circuit includes third and fourth groups of stacked transistors. The third group of stacked transistors transfers the signals formatted in accordance to the first signal transmission protocol from the group of signal transmission protocols. The fourth group of stacked transistors transfers the signals formatted in accordance to the plurality of signal transmission protocols from the group of signal transmission protocols.

19 Claims, 8 Drawing Sheets

(56) References Cited

U.S. PATENT DOCUMENTS

| | | | |
|---|---|---|---|
| 7,724,026 B1 * | 5/2010 | Tan | H03K 19/018528 326/30 |
| 7,817,727 B2 * | 10/2010 | Kumar | G06F 13/4086 375/258 |
| 7,855,577 B1 | 12/2010 | Teng et al. | |
| 8,026,740 B2 * | 9/2011 | Hollis | H03K 19/0002 326/59 |
| 8,390,315 B1 * | 3/2013 | Wang | H03K 19/01721 326/26 |
| 8,461,882 B2 * | 6/2013 | Chang | H03K 19/018528 326/82 |
| 8,731,410 B2 * | 5/2014 | Welch | H04L 25/0272 330/295 |
| 9,054,578 B2 * | 6/2015 | Hsieh | H02M 1/088 |
| 9,065,399 B2 * | 6/2015 | Wang | H03K 19/018585 |
| 9,641,141 B1 * | 5/2017 | Zheng | H03F 3/2171 |

* cited by examiner

DUAL SIGNAL PROTOCOL INPUT/OUTPUT (I/O) BUFFER CIRCUIT

BACKGROUND

The latest generation of field programmable gate array (FPGA) devices includes input/output (I/O) circuits that can be configured to transfer signals based on various different types of signal transmission protocols. Two of the most common signal transmission protocols that an I/O circuit is designed to transfer include a double data rate (DDR) signal protocol and a low voltage differential signal (LVDS) protocol.

However, with every new generation of process technology, transistor features and signal pathway dimensions have been pushed to become smaller. The smaller transistor features and the signal pathway dimensions inadvertently generate a high parasitic capacitance along signal pathways on an integrated circuit. Even the I/O circuit designs that can be configured to transfer DDR signals and LVDS signals are affected by a high pad capacitance. The I/O circuits in the latest generation of integrated circuit devices may have signal pathways with a pad capacitance value greater than 2 Pico farads (pF).

The high pad capacitance value limits the performance of the I/O circuit. For example, the high pad capacitance may limit the transmitting or receiving speeds of the DDR signals to a value less than 2 Gigabits per second (Gbps).

Further, conventional I/O circuit designs also suffer from local temperature effect (LTE) degradation. The LTE degradation occurs when excessive heat is dissipated within the transistors comprising the I/O circuit. The LTE degradation may causes the transistors within the I/O buffer circuits to be less reliable over time.

SUMMARY

Embodiments described herein include a dual signal protocol I/O buffer circuit and a method of configuring the I/O buffer circuit to a particular signal protocol. It should be appreciated that the embodiments can be implemented in numerous ways, such as a process, an apparatus, a system, a device, or a method. Several embodiments are described below.

In one embodiment, an integrated circuit (IC) device includes a first input/output (I/O) buffer circuit. The first I/O buffer circuit may be utilized to transfer signals based on a signal protocol selected from a group of signal protocols. The first input/output buffer circuit includes first and second groups of stacked transistors. The first group of stacked transistors transfer signals formatted in accordance with only one signal protocol from the group of signal protocols. The second group of stacked transistors transfers the signals formatted in accordance with more than one signal protocols.

In another embodiment, an integrated circuit device includes a first input/output (I/O) buffer circuit, a second I/O buffer circuit and interconnections. The first I/O buffer circuit may transfer signals in accordance to a signal protocol selected from first and second signal protocols. The second input/output buffer circuit may transfer signals in accordance to the signal protocol selected from the first and second signal protocols. The interconnections may be coupled to the first and second I/O buffer circuits. The interconnections are disabled when the first and second I/O buffer circuits are configured to receive signals according to the first and second signal protocols.

In an alternative embodiment, a method of operating an integrated circuit device that comprises first, second, third and fourth groups of stacked transistors may include a step to receive configuration information for the first, second, third and fourth groups of stacked transistor. In addition, the method includes a step to configure the first, second, third and fourth stacked transistors using the received configuration information to transfer signals in accordance to a selected signal protocol from a group of first and second signal protocols.

Further features, its nature and various advantages will be more apparent from the accompanying drawings and the following detailed description of the preferred embodiments.

DETAILED DESCRIPTION

The following description describes a dual signal transmission protocol I/O buffer circuit and a method of configuring the I/O buffer circuit to a particular signal transmission protocol. It will be obvious, to one skilled in the art, that the present exemplary embodiments may be practiced without some or all of these specific details. In other instances, well-known operations have not been described in detail in order not to unnecessarily obscure the present embodiments.

Throughout this specification, when an element is referred to as being "connected" or "coupled" to another element, it may be directly connected or coupled to the other element or electrically connected or coupled to the other element with yet another element interposed between them.

Figure 1:
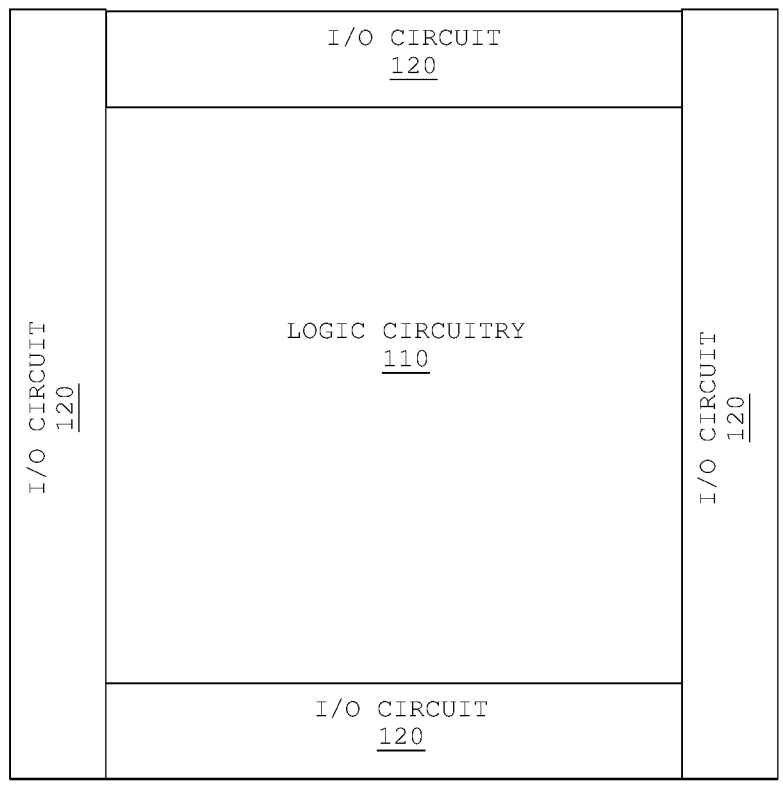
FIG. 1 shows an illustrative integrated circuit (IC) device with an input/output (I/O) circuit in accordance with an embodiment.

FIG. 1, meant to be illustrative and not limiting, illustrates an integrated circuit (IC) device in accordance with an embodiment of present invention. Integrated circuit device 100 includes logic circuitry 110 and multiple input/output (I/O) circuits 120.

In one embodiment, integrated circuit device 100 may be an application specific integrated circuit (ASIC) device, an application standard specific product (ASSP) device, a programmable logic device (PLD) or a microprocessor device. In general, ASIC, ASSP and microprocessor devices may perform fixed and dedicated functions. PLD devices may be programmable to perform a variety of functions. An example of a PLD device may be a field programmable gate array (FPGA) device. Microprocessor devices, coupled together with other devices (e.g., a memory device), may be utilized to perform instructions provided within a programming code.

Integrated circuit device 100 may be used in different types of high speed systems, for example a communication system such as wireless systems, wired systems, etc. In one embodiment, integrated circuit device 100 may be a PLD utilized for controlling data transfer between different devices, for example, a microprocessor device and/or a memory device. In addition, integrated circuit device 100 may include circuits to allow integrated circuit device 100 to communicate with external devices such as memory devices (not shown). Each of these circuits may be defined based on a particular signal protocol.

Referring still to FIG. 1, I/O circuits 120 occupies the peripheral portion of integrated circuit device 100, whereas logic circuitry 110 occupies the center region of integrated circuit device 100. It should be appreciated that the arrangement of I/O circuits 120 and logic circuitry 110 on integrated circuit device 100 may vary depending on the requirements of a particular device.

In one embodiment, logic circuitry 110 may perform core functions of integrated circuit device 100. Logic circuitry 110 may include specific circuitry for the functions that defines integrated circuit device 100. For example, logic circuitry 110 may include circuits that perform memory device addressing and processing of information retrieved from the memory device when integrated circuit device 100 is a memory controller. In another example, logic circuitry 110 may include programmable logic elements when the integrated circuit device is a PLD. The programmable logic elements may further include circuits such as look-up table (LUT) circuitry, multiplexers, product-term logic, registers, memory circuits and the like. The programmable logic elements may be programmed by a user (e.g., a designer or an engineer) to perform desired functions.

I/O circuits 120 may be utilized for transferring signals in to or out of integrated circuit device 100. For example, signals from logic circuitry 110 may be transferred out of integrated circuit device 100 through one of these I/O circuits 120. Additionally, signals received from an external device (external to integrated circuit device 100) may be transferred to logic circuitry 110 through one of these I/O circuits 120. In one embodiment, I/O circuits 120 may be considered as external interfacing circuitry of integrated circuit device 100. Signals may be transferred out or received by one of these I/O circuits 120 through its respective I/O pads (not shown).

I/O circuit 120 may further include an input/output (I/O) buffer circuit. The I/O buffer circuit may be configurable to a send/receive signals having a particular standard signal protocol selected from a group of different types of standard signal protocols. In other words, the I/O buffer circuit may be operable in multiple modes, with each mode corresponding to a respective configuration for sending/receiving signals having a particular standard signal protocol. The mode in which the I/O buffer circuit is configured (i.e., the particular standard signal protocol which the I/O buffer circuit is configured to send/receive) may depend on the external signal interface. In one exemplary embodiment, the standard signal protocols that the I/O buffer circuit may be configured to send/receive may include a double data rate (DDR) protocol and a low voltage differential signal (LVDS) protocol. The I/O buffer circuit may be configured to send/receive signals having the DDR protocol when integrated circuit device 100 is coupled to a memory device, in one embodiment. Alternatively, the I/O buffer circuit may be configured to send/receive signal having the LVDS protocol when integrated circuit device 100 forms a part of a telecommunication network system.

Further, each I/O buffer circuit within I/O circuits 120 may be configurable to receive signals and/or to transmit signals. An I/O buffer circuit configured to receive signals may receive signals from an external device (e.g., the memory device or a device within the telecommunication network). Alternatively, an I/O buffer circuit configured to transmit signals may transmit signal out of the integrated circuit device 100 to an external device.

It should be appreciated that the I/O buffer circuits may be configured through user inputs. In one embodiment, the user may input these user inputs through configuration software (e.g., Quartus® II of Altera® Corporation). Through these user inputs, the user may configure the I/O buffer circuits and enables integrated circuit device 100 to communicate externally using different signal protocols.

Figure 2:
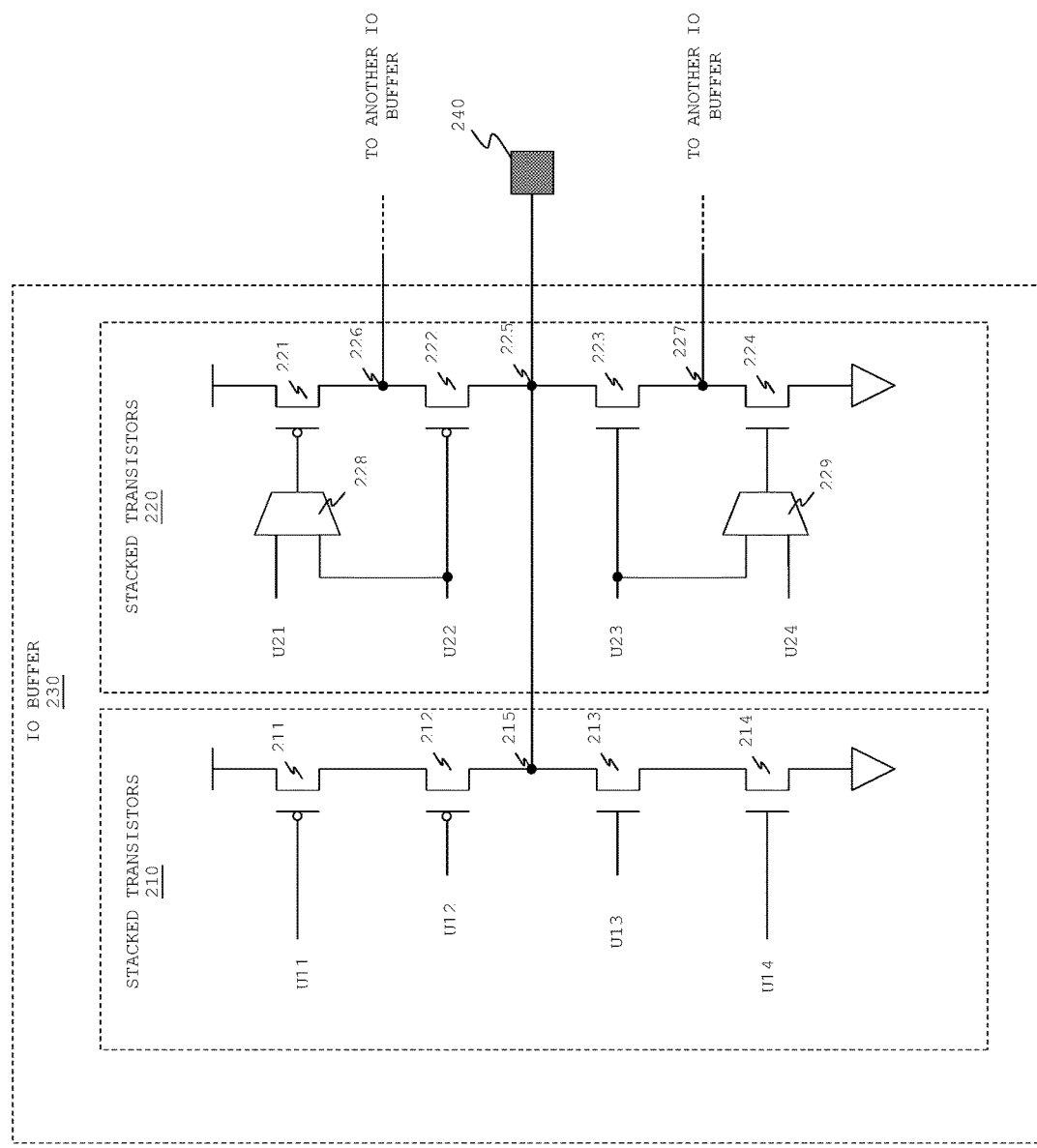
FIG. 2 shows an illustrative input/output (I/O) buffer circuit in accordance with an embodiment.

FIG. 2, meant to be illustrative and not limiting, illustrates an input/output (I/O) buffer circuit in accordance with one embodiment of the present invention. I/O buffer circuit 230 may be similar to the abovementioned I/O buffer circuit of I/O circuit 120. I/O buffer circuit 230 is coupled to I/O pad 240.

As shown in the embodiment of FIG. 2, I/O buffer circuit 230 includes two stacks of transistors 210 and 220. Stacked transistors 210 include two p-channel transistors 211 and 212 and two n-channel transistors 213 and 214. Similarly, stacked transistors 220 include two p-channel transistors 221 and 222 and two n-channel transistors 223 and 224. The p-channel transistors 211 and 212 and re-channel transistors 213 and 214 are coupled serially and p-channel transistors 221 and 222 and n-channel transistors 223 and 224 are also coupled serially. As shown in FIG. 2, stacked transistors 220 may be coupled in parallel to stacked transistors 210. Furthermore, stacked transistors 210 and 220 may be coupled together through their nodes 215 and 225, respectively.

In one embodiment, gate terminals of transistors 211-214 and transistors 221-224 may be coupled to configuration memory (not shown) formed within an integrated circuit device (e.g., integrated circuit device 100 of FIG. 1). Therefore, the gate terminals of transistors 211-214 may receive user configuration signals U11, U12, U13 and U14, respectively, and the gate terminals of transistors 221-224 may receive user configuration signals U21, U22, U23 and U24, respectively. These user configuration signals U11, U12, U13, U14, U21, U22, U23 and U24 may be supplied through the user inputs stored within the configuration memory. Each of these user signals may either activate or deactivate transistors 211-214 and transistors 221-224.

In one embodiment, configuration memory may be available in an FPGA device and/or a PLD. The configuration memory may form a part of logic circuitry 110 of FIG. 1, in one embodiment. During the initialization phase of the FPGA device/PLD, the configuration memory may get programmed by the user information.

Furthermore, transistors 211-214 and transistors 221-224 may be activated or deactivated based on supplying appropriate voltages. For example, an n-channel transistor may be activated when its gate is supplied with a voltage level higher than its threshold voltage and its source-drain voltage. A p-channel transistor may be activated when its gate terminal is at a voltage level lower than its threshold voltage level and its source-drain voltage.

In one embodiment, transistors 211-214 and 221-224 may be metal oxide semiconductor field effect transistors (MOSFETs). Alternatively, transistors 211-214 and 221-224 may be fin field effect transistors (FinFETs).

The arrangement of transistors 211-214 and 221-224 (i.e., in serial manner) helps significantly to reduce the local temperature effect (LTE) reliability issue that was mentioned in the background. This is because voltage levels supplied to these transistors are divided between the serially coupled transistors, which help to control the local temperature within the transistors.

It should be appreciated that power dissipation through a transistor may have a direct consequence on the LTE reliability of the transistor. Power dissipated through the transistor increases the transistor's temperature. When a relatively large amount of power is dissipated through a single transistor, a correspondingly high temperature change (i.e., a temperature increase) may occur in the transistor, which may affect the reliability of the transistor.

In one embodiment, the design of stacked transistors 210 and 220 provides a circuit designer with additional adjustable design parameters: (i) transistor sizes and (ii) voltage levels supplied at the gate terminals of the transistors.

In one embodiment, the circuit designer may adjust the transistor sizes in order to reduce the LTE issue. For example, the transistors attached directly to I/O pad 240 (e.g., p-channel transistors 212 and 222 and n-channel transistors 213 and 223) may be designed to be at least 2×-3× larger in their size than transistors connected directly to the power/ground rails (e.g., p-channel transistors 211 and 221 and n-channel transistors 214 and 224). Adjusting the transistor sizes may help to reduce the voltage swings across the transistors 211-214 and 221-224, which may the help to reduce the power dissipation and the LTE issue.

In addition, the circuit designer may supply appropriate voltage levels to different transistors within the stacked transistors design (e.g., transistors 211-214 and 221-224) in order to reduce the LTE issue. For example, the transistors directly attached to I/O pad 240 (e.g., p-channel transistors 212 and 222 and n-channel transistors 213 and 223) may be biased to a voltage level that is different than the transistors connected directly to the power/ground rails (e.g., p-channel transistors 211 and 221 and n-channel transistors 214 and 224). In one embodiment, biasing transistors 211-214 and 221-224 using different voltage levels may help to divide voltage levels evenly across transistors 211-214 and 221-224.

Within stacked transistors 210, p-channel transistors 211 and 212 may form a pull-up circuit and re-channel transistors 213 and 214 may form a pull-down circuit. Similarly, within stacked transistors 220, p-channel transistors 221 and 222 may form a pull-up circuit and n-channel transistors 223 and 224 may form a pull-down circuit. Generally, the pull-up circuit increases a voltage level of a signal from a particular voltage level to a voltage level higher than the particular voltage level. In contrast, the pull-down circuit decreases a voltage level of a signal from a particular voltage level to a voltage level lower than the particular voltage level.

In one embodiment, stacked transistors 210 may be used to transfer signals of one type of signal protocol (e.g., a DDR protocol). Stacked transistors 210 may be configured to receive a DDR protocol signal through I/O pad 240. In addition, stacked transistors 210 may be configured to transmit a DDR protocol signal through I/O pad 240. Stacked transistors 210 may also be referred to as a signal termination circuit when used as a receiver and as a signal driver circuit when used as a transmitter.

In one embodiment, stacked transistors 210 are activated when transferring signals based on particular signal protocols (e.g., the DDR protocol signals) from a group of signal protocols. In contrast, stacked transistors 220 are activated/switched-on when I/O buffer circuit 230 is utilized for transferring signals based on DDR and other signal protocols (e.g., the LVDS protocol signals). Activating stacked transistors 220 only when receiving signals of a particular signal protocol helps to reduce a parasitic capacitance formed on a signal pathway that couples terminals 215 and 225 and I/O pad 240.

Stacked transistor 220 may be used for two signal protocols (e.g., a DDR protocol and a LVDS protocol). In one embodiment, stacked transistors 220 may be configured to transmit a DDR protocol signal out of I/O buffer circuit 230 through I/O pad 240 or may be configured to transmit/receive an LVDS protocol signal for I/O buffer circuit 230 through I/O pad 240. The table A below shows activation and deactivation of stacked transistors 210 and 220 for receiving signals and transferring signals for respective DDR and LVDS protocols.

TABLE A

| | DDR protocol | LVDS protocol |
| --- | --- | --- |
| Receiving signals | 210 ON; 220 off | 210 OFF; 220 ON |
| Transferring signals | 210 ON; 220 ON | 210 OFF; 220 ON |

Referring still to FIG. 2, stacked transistors 210 and 220 may be configured to different signal protocols by activating and deactivating appropriate transistors 211-214 and 221-224. The activating and deactivating is controlled by the user signals (e.g., U11, U12, U13, U14, U21, U22, U23 and U24).

Figure 3:
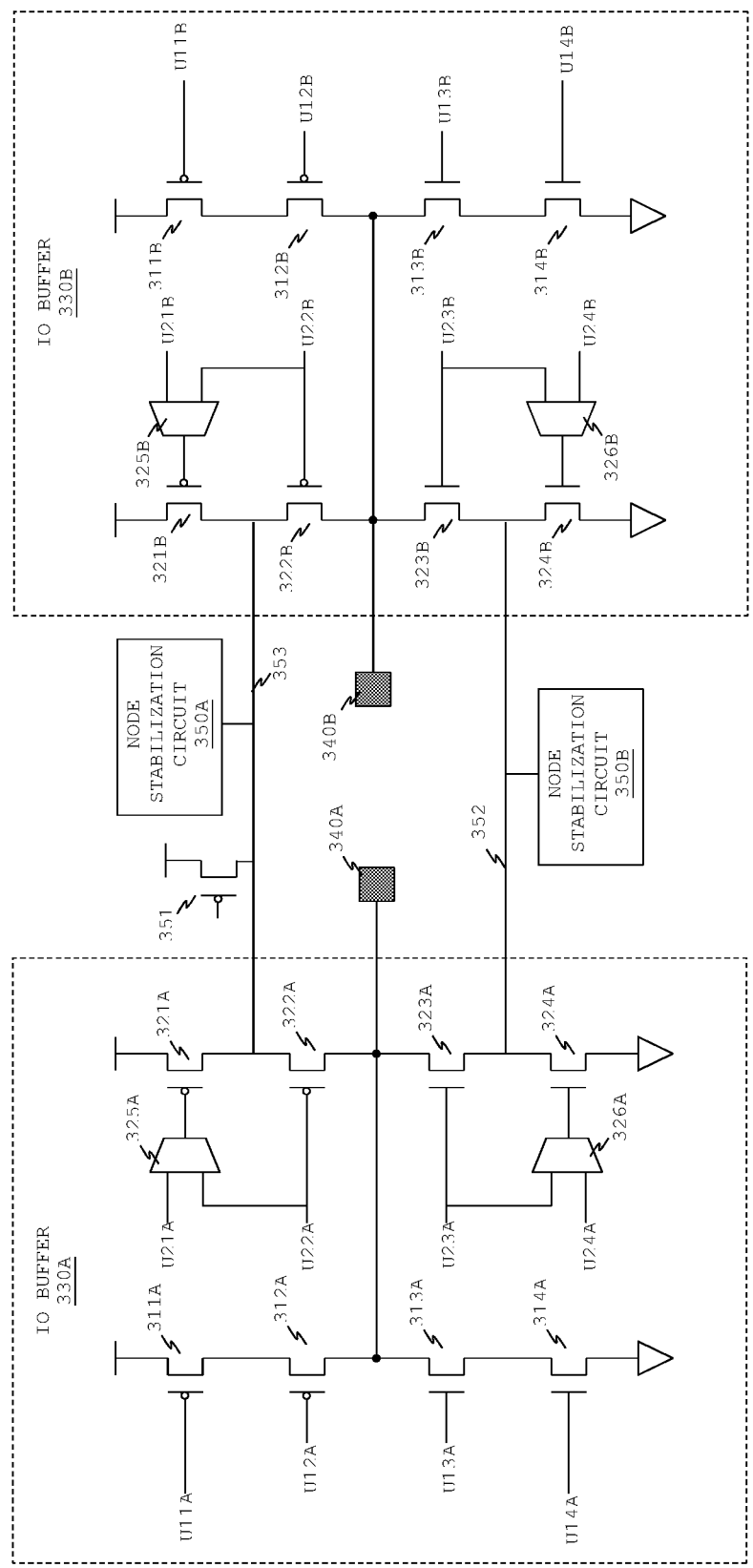
FIG. 3 shows two illustrative I/O buffer circuits implemented in a current-mode configuration in accordance with an embodiment.

FIG. 3, meant to be illustrative and not limiting, illustrates two I/O buffer circuits implemented in a current mode configuration in accordance with one embodiment of the present invention. I/O buffer circuits 330A and 330B may be configurable to transfer (e.g., transmit or receive) signals based on a signal protocol selected from a group of signal protocols. I/O buffer circuit 330A and 330B may be configured by activating or deactivating transistors of the respective I/O buffer circuits 330A and 330B based on user signals U11A, U12A, U13A, U14A, U21A, U22A, U23A, U24A, U11B, U12B, U13B, U14B, U21B, U22B, U23B and U24B.

It should be appreciated that the transistors may be activated or deactivated by supplying appropriate voltages to their respective gate terminals. For example, a p-channel transistor may be activated when its gate terminal is supplied with a voltage level less than a voltage level at its source-drain terminals. An n-channel transistor may get activated when its gate terminal is supplied with a voltage level greater than the voltage level at its source-drain terminals.

In one embodiment, the group of signal protocols may include a DDR signal transmission protocol and an LVDS signal transmission protocol.

As shown in the embodiment of FIG. 3, I/O buffer circuit 330A include p-channel transistors 311A, 312A, 321A and 322A, n-channel transistors 313A, 314A, 323A and 324A and multiplexers 325A and 326A. I/O buffer circuits 330B include p-channel transistors 311B, 312B, 321B and 322B, n-channel transistors 313B, 314B, 323B and 324B and multiplexers 325B and 326B. Within I/O buffer circuit 330A, p-channel transistors 311A and 312A and n-channel transistors 313A and 314A form a group of stacked transistors and p-channel transistors 321A and 322A and n-channel transistors 323A and 324A forms another group of stacked transistors. Similarly, within I/O buffer circuit 330B, p-channel transistors 311B and 312B and n-channel transistors 313B and 314B forms a group of stacked transistors and p-channel transistors 321B and 322B and n-channel transistors 323B and 324B forms another group of stacked transistors.

In one embodiment, these groups of stacked transistors within each of these I/O buffer circuits 330A and 330B may be similar to stacked transistors 210 and 220 of FIG. 2. For example, p-channel transistors 311A, 312A, 321A, 322A and n-channel transistors 313A, 314A, 323A and 324A may be similar to p-channel transistors 211, 212, 221, 222 and n-channel transistors 213, 214, 223 and 224, respectively. Similarly, p-channel transistors 311B, 312B, 321B, 322B and n-channel transistors 313B, 314B, 323B and 324B may be similar to p-channel transistors 211, 212, 221, 222 and n-channel transistors 213, 214, 223 and 224, respectively.

Referring still to FIG. 3, I/O buffer circuits 330A and 330B may be coupled together through interconnections 352 and 353. As shown in the embodiment of FIG. 3, interconnection 352 is coupled to the drain terminal of p-channel transistor 321A and the source terminal of 322A within I/O buffer circuit 330A and to the drain terminal of p-channel transistor 321B and the source terminal of 322B within I/O buffer circuit 330B. Interconnection 353 is coupled to the source terminal of n-channel transistor 323A and the drain terminal of transistor 324A within I/O buffer circuit 330A and to the source terminal of n-channel transistor 323B and the drain terminal of 324B within I/O buffer circuit 330B.

Interconnection 353 may further include p-channel transistor 351. A drain terminal of p-channel transistor 351 is coupled to interconnection 353 and another source terminal is coupled to a power rail that is at the Vcc voltage level. In one embodiment, p-channel transistor 351 may be a current source. In addition, p-channel transistor 351 may be relatively large in its size to support 1.25 V common modes when the power rail is at 1.8 V.

In addition, interconnection 353 can also include, or be coupled to, a node stabilization circuit 350A. Similarly, interconnection 352 can also include, or be coupled to, a node stabilization circuit 350B. It should be appreciated that node stabilization circuits 350A and 350B may be optional circuits and may be omitted in certain embodiments. Node stabilization circuits 350A and 350B may be activated/turned-on when the transistors are switched dynamically from an enable mode to a disable mode within the I/O buffer circuits 330A and 330B. Therefore, node stabilization circuits 350A and 350B prevents a high transient electrical current and prevents excessive voltage swinging.

I/O buffer circuits 330A and 330B may be configured to transmit two different DDR signals out through their respective I/O pads 340A and 340B. Furthermore, I/O buffer circuits 330A and 330B may be configured to receive two different DDR signals through their respective I/O pads 340A and 340B. I/O buffer circuits 330A and 330B may also be configured to receive LVDS signals. One of the LVDS signal may be received by I/O buffer circuit 330A through IO pad 340A and the other LVDS signal (i.e., a complementary signal relative to the LVDS signal) may be received by I/O buffer circuit 330B through I/O pad 340B. I/O buffer circuits 330A and 330B may also be configured to transmit out the LVDS signals. Similar to the receiving the LVDS signals, one of the LVDS signal may be transmitted out of I/O buffer circuit 330A through IO pad 340A and another LVDS signal (i.e., the complementary signal relative to the LVDS signal) may be transmitted out of I/O buffer circuit 330B through IO pad 340B.

When I/O buffer circuits 330A and 330B are configured to transmit signals out based on the DDR protocol, transistors 311A-314A, 321A-324A, 311B-314B and 321B-324B are activated. In one embodiment, the corresponding p-channel transistors 311A, 312A, 321A, 322A, 311B, 312B, 321B and 322B are activated when their respective gate terminals are supplied with a 0 volt (V). The corresponding n-channel transistors 313A, 314A, 323A, 324A, 313B, 314B, 323B and 324B are activated when their respective gate terminals are supplied with a Vcc (e.g., 1.0 V).

In one embodiment, when I/O buffer circuits 330A and 330B are configured to transmit signals out of an integrated circuit device based on the DDR protocol, I/O buffer circuit 330A may transmit a DDR signal through I/O pad 340A and I/O buffer circuit 330B may transmit a DDR signal through I/O pad 340B. In one embodiment, the two DDR signals may include bits carried for data signals or addressing signals.

When I/O buffer circuits 330A and 330B are configured to receive signals for the integrated circuit device based on the DDR protocol, transistors 311A-314A and 311B-314B are activated whereas transistors 321A-324A and 321B-324B are deactivated.

Referring still to FIG. 3, such activation and deactivation refers to one of the stacked transistors 330A or 330B within each I/O buffer circuit being activated while the other is deactivated. The activation/deactivation may mask a number of transistors from the signal pathways that are coupled to their respective I/O pads 340A and 340B. In addition, the activation/deactivation may mask capacitance of interconnections 352 and 353 from the signal pathways of respective I/O pads 340A and 340B. In one embodiment, the DDR signals may be only observe transistors 311A-314A within I/O buffer circuit 330A and transistors 311B-314B within I/O buffer circuit 330B. The remaining transistors (i.e., transistors 321A, 324A, 321B, 324B, and 351) are masked off (i.e., electrically disconnected from or invisible to the signal path for received/transmitted signals), and hence do not contribute to any capacitance for the incoming DDR signals.

When I/O buffer circuits 330A and 330B are configured to transmit signals out of the integrated circuit device according using the LVDS transmission protocol, transistors 311A-314A and 311B-314B are deactivated, transistors 321A-324A and 321B-324B are activated and node stabilization circuits 350A and 350B are deactivated. Further, p-channel transistor 321A, 321B and 351 may be coupled to a bias voltage.

In one exemplary embodiment, the bias voltage may be sufficient to transmit a nominal 3.78 milliamperes (mA) through the transistors 351, 321A-324A and transistors 321B-324B with a nominal pulldown resistance value of 280 Ohms. Hence, I/O pads 340A and 340B may have a nominal voltage level of 1.25 V.

When I/O buffer circuits 330A and 330B are configured to receive signals into of the integrated circuit device using the LVDS transmission protocol, transistors 311A-314A, 311B-314B, 321A, 324A, 321B, 324B and 351 are deactivated, transistors 322A, 323A, 322B and 323B are activated and node stabilization circuits 350A and 350B are deactivated. Each of these transistors 322A, 323A, 322B and 323B acts as pass-gates when configured to receive signals based on the LVDS transmission protocol. Activating these transistors 322A, 323A, 322B and 323B may provide differential terminations of 100 Ohms to these respective I/O pads 340A and 340B.

Figure 4:
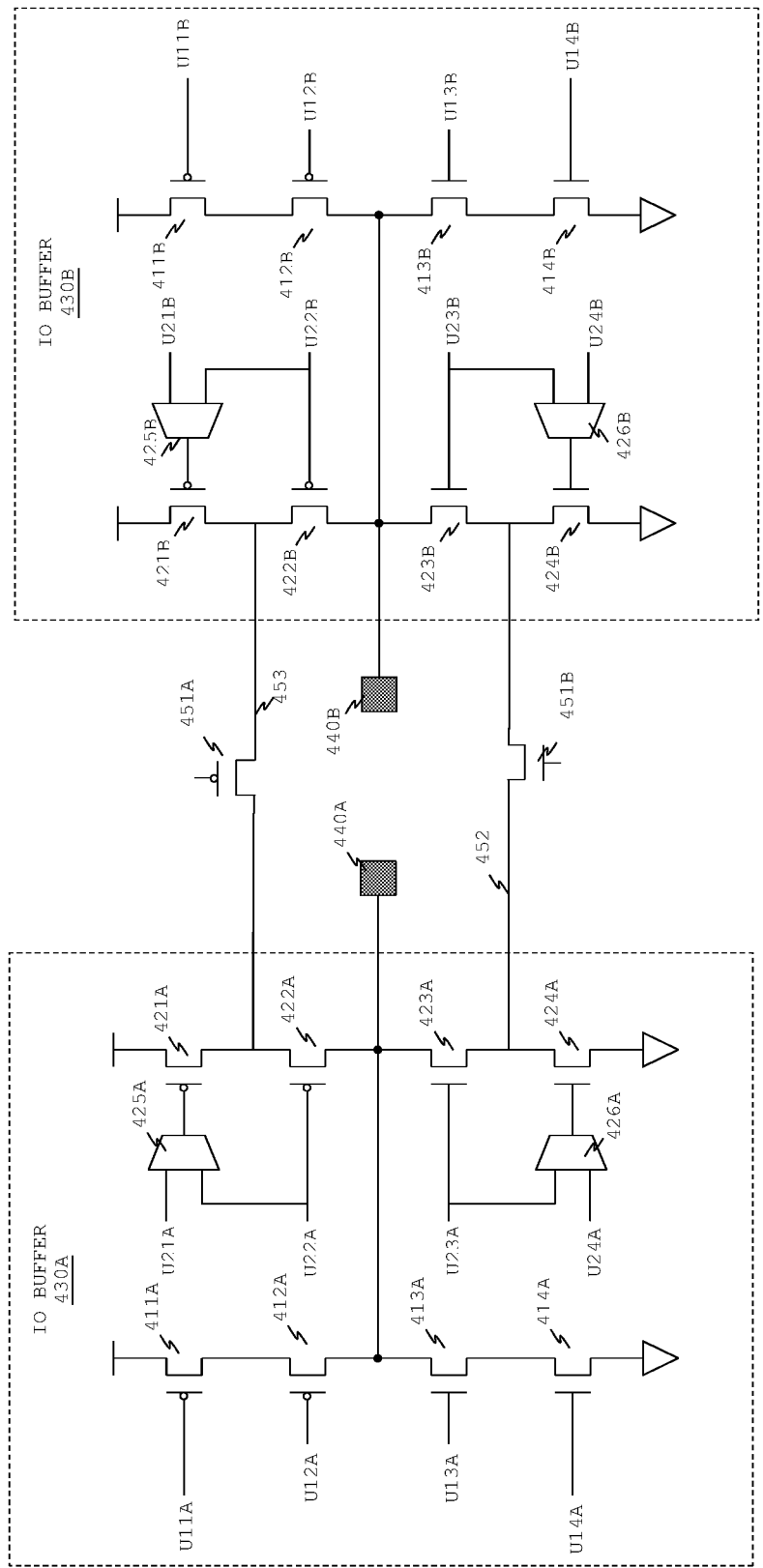
FIG. 4 shows two illustrative I/O buffer circuits implemented in a voltage-mode configuration in accordance with an embodiment.

FIG. 4, meant to be illustrative and not limiting, illustrates two I/O buffer circuits implemented in a voltage mode configuration in accordance with one embodiment of the present invention. Similar to I/O buffer circuits 330A and 330B of FIG. 3, I/O buffer circuits 430A and 430B may be configurable to transfer (e.g., transmit or receive) signals based on a signal protocol selected from a group of signal protocols. I/O buffer circuit 430A and 430B may be configured by activating or deactivating transistors of the respective I/O buffer circuits 430A and 430B. The manner in which to activate or to deactivate may be similar the manner as described in FIG. 3. In one embodiment, I/O buffer circuits 430A and 430B may provide lower parasitic capacitance on the signal pathways that are coupled to I/O pads 440A and 440B compared to the signal pathways coupled to I/O pads 340A and 340B of FIG. 3.

As shown in the embodiment of FIG. 4, I/O buffer circuits 430A include p-channel transistors 411A, 412A, 421A and 422A, n-channel transistors 413A, 414A, 423A and 424A and multiplexers 425A and 426A. I/O buffer circuits 430B include p-channel transistors 411B, 412B, 421B and 422B, re-channel transistors 413B, 414B, 423B and 424B and multiplexers 425B and 426B. Transistors 411A-414A, 421A-424A, 411B-414B and 421B-424B may be similar to transistors 311A-314A, 321A-324A, 311B-314B and 321B-324B, respectively, of FIG. 3.

Furthermore, multiplexers 425A, 426A, 425B and 426B may be similar to multiplexers 325A, 326A, 325B and 326B of FIG. 3. Therefore, further details of transistors 411A-414A, 421A-424A, 411B-414B and 421B-424B and multiplexers 425A, 426A, 425B and 426B will not be repeated again.

In addition, I/O buffer circuits 430A and 430B may be coupled to each other through interconnections 452 and 453. Interconnections 452 and 453 may be similar to interconnections 352 and 353 of FIG. 3. As shown in the embodiment of FIG. 4, interconnection 452 is coupled to the drain terminal of p-channel transistor 421A and to the source terminal of transistor 422A for I/O buffer circuit 430A and to the drain terminal of p-channel transistor 421B and to the source terminal of transistor 422B for I/O buffer circuit 430B. Interconnection 453 is coupled to the source terminal of n-channel transistor 423A and drain terminal of transistor 424A for I/O buffer circuit 430A and to the source terminal of n-channel transistor 423B and the drain terminal of transistor 424B for I/O buffer circuit 430B.

Referring still to FIG. 4, interconnection 453 includes p-channel transistor 451A (i.e., transistor 451A may be interposed within the interconnection 453) whereas interconnection 452 includes n-channel transistor 451B (i.e., transistor 451B may be interposed within the interconnection 452). Transistors 451A and 451B may act as pass-gate transistors within their respective interconnections 453 and 452. Disabling transistor 451A (i.e., asserting the gate voltage provided to p-channel transistor 451A) may be referred to as disabling the interconnection 453, whereas disabling the transistor 451B (i.e., deasserting the gate voltage provided to n-channel transistor 451B) may be referred to as disabling the interconnection 452.

Similar to I/O buffer circuits 330A and 330B of FIG. 3, I/O buffer circuits 430A and 430B may be configurable to transmit two different DDR signals out through their respective I/O pads 440A and 440B. Furthermore, I/O buffer circuits 430A and 430B may be configurable to receive two different DDR signals through their respective I/O pads 440A and 440B. I/O buffer circuits 430A and 430B may also be configurable to receive LVDS signals. One of the LVDS signal may be received by I/O buffer circuit 430A through I/O pad 440A and the other LVDS signal (i.e., a complementary signal relative to the LVDS signal) may be received by I/O buffer circuit 430B through I/O pad 440B. I/O buffer circuits 430A and 430B may also be configurable to transmit out the LVDS signals. Similar to the receiving the LVDS signals, one of the LVDS signal may be transmitted out of I/O buffer circuit 430A through I/O pad 440A and another LVDS signal (i.e., the complementary signal relative to the LVDS signal) may be transmitted out of I/O buffer circuit 430B through I/O pad 440B.

When I/O buffer circuits 430A and 430B are configured to transmit signals out based on the DDR protocol, transistors 411A-414A, 421A-424A, 411B-414B and 421B-424B are activated. Activating transistors 411A-414A, 421A-424A, 411B-414B and 421B-324B may result in high current through I/O pads 440A and 440B. The transistors 451 may be disabled when I/O buffer circuits 430 are configured to transmit DDR signals. Though it is not shown in FIG. 4, a node stabilization circuit 350 may be coupled to the interconnections 452/453.

In one embodiment, when I/O buffer circuits 430A and 430B are configured to transmit signals out of an integrated circuit device based on the DDR protocol, I/O buffer circuit 430A may transmit a DDR signal through IO pad 440A and I/O buffer circuit 430B may transmit a DDR signal through IO pad 440B. In one embodiment, the two DDR signals may include bits carried for data signals or addressing signals.

When I/O buffer circuits 430A and 430B are configured to receive signals for the integrated circuit device based on the DDR protocol, transistors 411A-414A and 411B-414B are activated whereas transistors 421A-424A and 421B-424B are deactivated.

When I/O buffer circuits 430A and 430B are configured to transmit signals out of the integrated circuit device according using the LVDS protocol, transistors 411A-414A, 411B-414B, 451A and 451B are deactivated and transistors 421A-424A and 421B-424B are activated. Such configuration may be similar to a pair of standalone inverters that are formed using stacked transistors 421A-424A and 421B-424B. In one embodiment, I/O buffer circuits 430A and 430B configured in such manner generates a differential voltage output at approximately 375 millivolts (mv) with a common voltage node of 1.25 V when having Vcc voltage levels of 1.8 V. I/O buffer circuits 430A and 430B may be configured in such manner as to generate two serially coupled resistors formed in parallel to another two serially coupled resistors. The underlying purpose is to generate an impedance value of 50 Ohms to enable transmission of signals without any reflection (i.e., low return loss) into the I/O buffer circuits 430A and 430B. In one exemplary embodiment, the first two serially coupled resistors may have resistance values of 56 Ohm and 480 Ohm and the other two serially coupled resistors may have resistance values of 100 Ohm and 100 Ohm.

When I/O buffer circuits 430A and 430B are configured to receive signals based on the LVDS protocol, transistors 411A-414A, 411B-414B, 421A, 424A, 421B and 424B are deactivated, transistors 422A, 423A, 422B, 423B, 451A and 451B are activated. In one embodiment, I/O buffer circuits 430A and 430B may be configured in similar manner as to I/O buffer circuits 330A and 330B, with the exception that for I/O buffer circuits 430A and 430B, transistors 451A and 451B (also known as pass-gate transistors) are activated.

Figure 5:
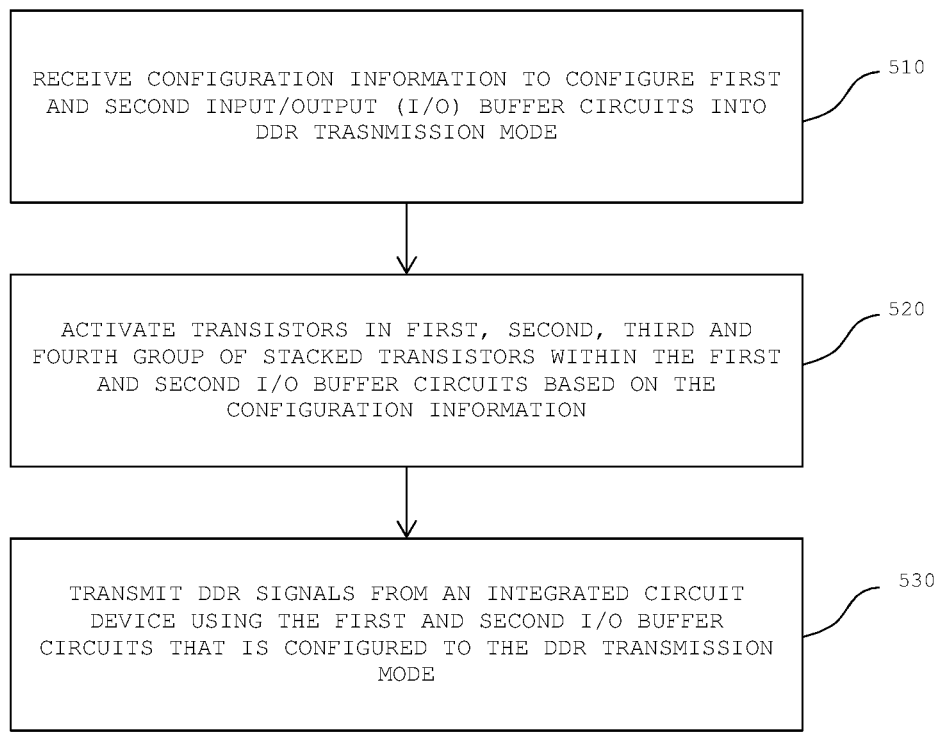
FIG. 5 shows an illustrative flowchart of a method to configure two input/output (I/O) buffer circuits to transmit double data rate (DDR) protocol based signals through an integrated circuit device in accordance with an embodiment.

FIG. 5, meant to be illustrative but not limiting, illustrates a method of configuring two input/output (I/O) buffer circuits of an integrated circuit device to transmit double data rates (DDR) signals in accordance with one embodiment of the present invention. In one embodiment, the two I/O buffer circuits may be configured to transfer signals in accordance to a selected signal protocol from a group of signal transfer protocols. The I/O buffer circuits may be similar to I/O buffer circuits 330A and 330B of FIG. 3 or I/O buffer circuits 430A and 430B of FIG. 4. Each I/O buffer circuit may include two groups of stacked transistors. For example, one of the I/O buffer circuit include transistors 311A-314A and transistors 321A-324A of FIG. 3 and another one of the I/O buffer circuits include transistors 311B-314B and transistors 321B-324B of FIG. 3. Therefore, there may be four groups of stacked transistors within the two I/O buffer circuits, and may be referred to as first, second, third and fourth groups of stacked transistors.

At step 510, configuration information to configure first and second I/O buffer in accordance to a DDR protocol is received. In one embodiment, the configuration information may be provided through a computer aided design (CAD) tool, such as, Quartus® II. The configuration information may be stored inside of the configuration memory (CRAM). The configuration information may be supplied to the transistors that are formed in the group of stacked transistors within I/O buffer circuits to activate or deactivate the transistors. The configuration information includes information to configure the I/O buffer circuits to a transmission mode for double data rate signals.

At step 520, all of the transistors that in first, second, third and fourth group of stacked transistors within their respective first and second I/O buffer circuits are activated. In one exemplary embodiment, activating all of the transistors that forms part of the first, second, third and fourth group of the stacked transistors may be similar to activating transistors 311A-314A, 321A-324A, 311B-314B and 321B-324B of FIG. 3 or activating transistors 411A-414A, 421A-424A, 411B-414B and 421B-424B of FIG. 4.

At step 530, DDR signals may be transmitted out of an integrated circuit device using the configured I/O buffer circuits. The DDR signals may be transmitted out through IO pads (e.g., I/O pads 340A and 340B of FIG. 3 or I/O pads 440A and 440B of FIG. 4).

Figure 6:
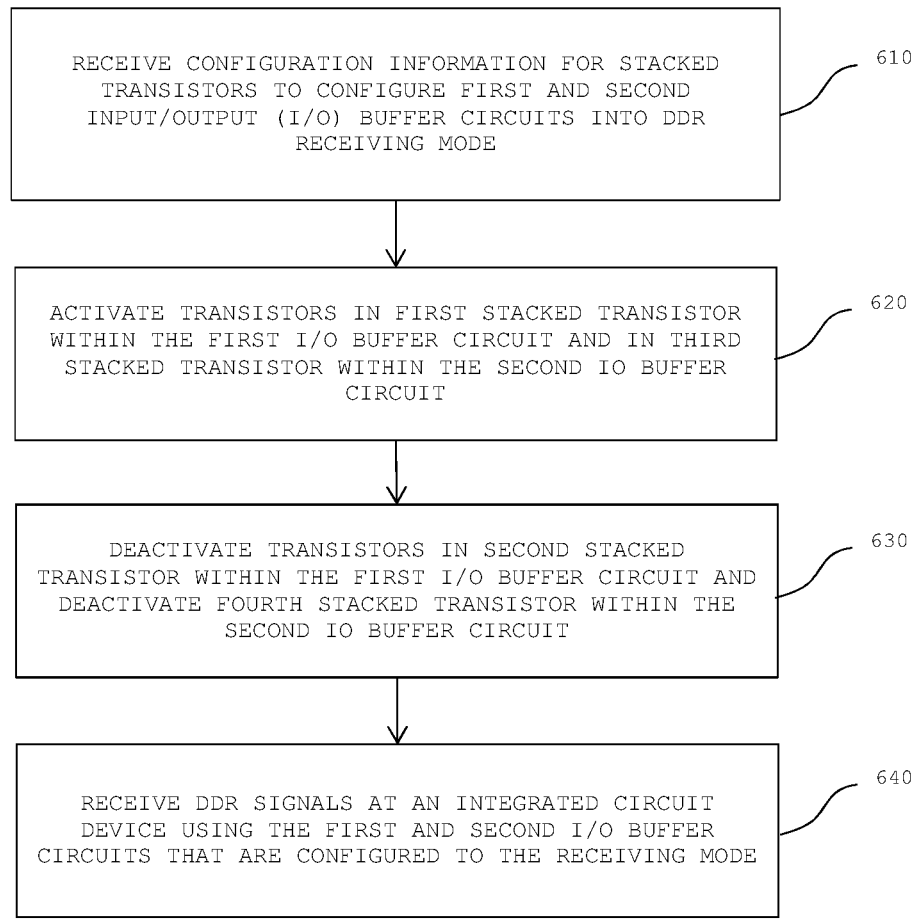
FIG. 6 shows an illustrative flowchart of a method to configure two input/output (I/O) buffer circuits to receive DDR protocol based signals using an integrated circuit device in accordance with an embodiment.

FIG. 6, meant to be illustrative but not limiting, illustrates a method of configuring two input/output (I/O) buffer circuits of an integrated circuit device to receive DDR signals in accordance with one embodiment of the present invention. As described in FIG. 5, the first and second I/O buffer circuits may be similar to I/O buffer circuits 330A and 330B of FIG. 3 or I/O buffer circuits 430A and 430B of FIG. 4. Each I/O buffer circuit may include two groups of stacked transistors. For example, one of the I/O buffer circuit include transistors 311A-314A and transistors 321A-324A of FIG. 3 and another one of the I/O buffer circuits include transistors 311B-314B and transistors 321B-324B of FIG. 3. Hence, there may be four groups of stacked transistors for two I/O buffer circuits, and may be referred to as first, second, third and fourth groups of stacked transistors.

At step 610, which is similar to step 510 of FIG. 5, configuration information to configure first and second I/O buffer to receive DDR signals in accordance to a DDR protocol is received.

At step 620, transistors that form part of the first group of stacked transistors within the first I/O buffer circuit are activated. Furthermore, the transistors that form part of the third group of stacked transistors within the second I/O buffer circuit are activated. In one exemplary embodiment, the transistors that form part of the first and third stacked transistors may be similar to transistors 311A-314A and 311B-314B of FIG. 3 or transistors 411A-414A and 411B-414B of FIG. 4.

At step 630, transistors that form part of the second group of stacked transistors within the first I/O buffer circuit are deactivated. Furthermore, transistors that form part of the fourth group of stacked transistors within the second I/O buffer circuit are deactivated. In one exemplary embodiment, the transistors that form part of the second and fourth group of stacked transistors may be similar to transistors 321A-324A and 321B-324B of FIG. 3 or transistors 421A-424A and 421B-424B of FIG. 4.

At step 640, DDR signals may be received into the integrated circuit device through the configured I/O buffer circuits. The DDR signals may be received through I/O pads (e.g., I/O pads 340A and 340B of FIG. 3 or I/O pads 440A and 440B of FIG. 4).

Figure 7:
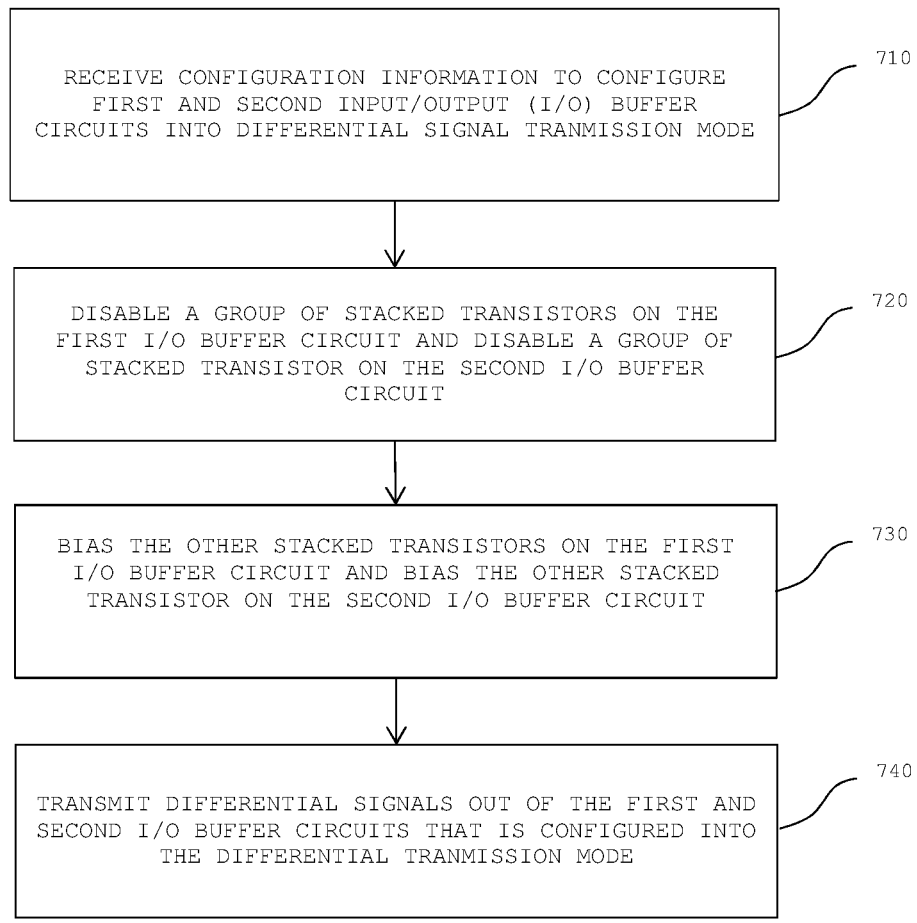
FIG. 7 shows an illustrative flowchart of a method to configure two input/output (I/O) buffer circuits to transmit low voltage differential signals (LVDS) protocol based signals using an integrated circuit device in accordance with an embodiment.

FIG. 7, meant to be illustrative but not limiting, illustrates a method of configuring two input/output (IO) buffer circuits of an integrated circuit device to transmit LVDS signal in accordance with one embodiment of the present invention. As described in FIGS. 5 and 6, the first and second I/O buffer circuits may be similar to I/O buffer circuits 330A and 330B of FIG. 3 or I/O buffer circuits 430A and 430B of FIG. 4. Each I/O buffer circuit may include two groups of stacked transistors, and hence in total there may be four groups of stacked transistors for two I/O buffer circuits, which may be referred to as first, second, third and fourth groups of stacked transistors.

At step 710, which is similar to step 510 of FIG. 5, configuration information to configure first and second I/O buffer to transmit LVDS signals in accordance to a LVDS protocol is received.

At step 720, a group of stacked transistors in the first I/O buffer circuit are deactivated. Furthermore, a group of stacked transistors in the second I/O buffer circuit are deactivated. In one embodiment, the first and third groups of stacked transistors are deactivated. In one exemplary embodiment, transistors forming the group of stacked transistor in the first and second I/O buffer circuits that are deactivated may be transistors 311A-314A and 311B-314B of FIG. 3 or transistors 411A-414A and 411B-414B of FIG. 4.

At step 730, another group of stacked transistors in within the first I/O buffer circuit are biased. Furthermore, another group of stacked transistors within the second I/O buffer circuit are biased. In one embodiment, these groups of stacked transistor may be the second and fourth group of stacked transistors. In one exemplary embodiment, the transistors that form part of the second and fourth group of stacked transistors may be similar to transistors 321A-324A and 321B-324B of FIG. 3 or transistors 421A-424A and 421B-424B of FIG. 4.

As stated in FIGS. 3 and 4, such configuration may be similar to a pair of standalone inverters, which includes two serially coupled resistors formed in parallel to another two serially coupled resistors. The underlying purpose is to generate an impedance value of 50 Ohms to enable transmission of signals without any reflection (i.e., low return loss) into the I/O buffer circuits. In one exemplary embodiment, the first two serially coupled resistors may have resistance values of 56 Ohm and 480 Ohm and the other two serially coupled resistors may have resistance values of 100 Ohm and 100 Ohm. It should be appreciated that such resistance values may only applicable for voltage mode configuration (not the current mode configuration)

At step 740, the LVDS signals may be transmitted out of the integrated circuit device through the configured I/O buffer circuits. The DDR signals may be transmitted through I/O pads (e.g., I/O pads 340A and 340B of FIG. 3 or I/O pads 440A and 440B of FIG. 4).

Figure 8:
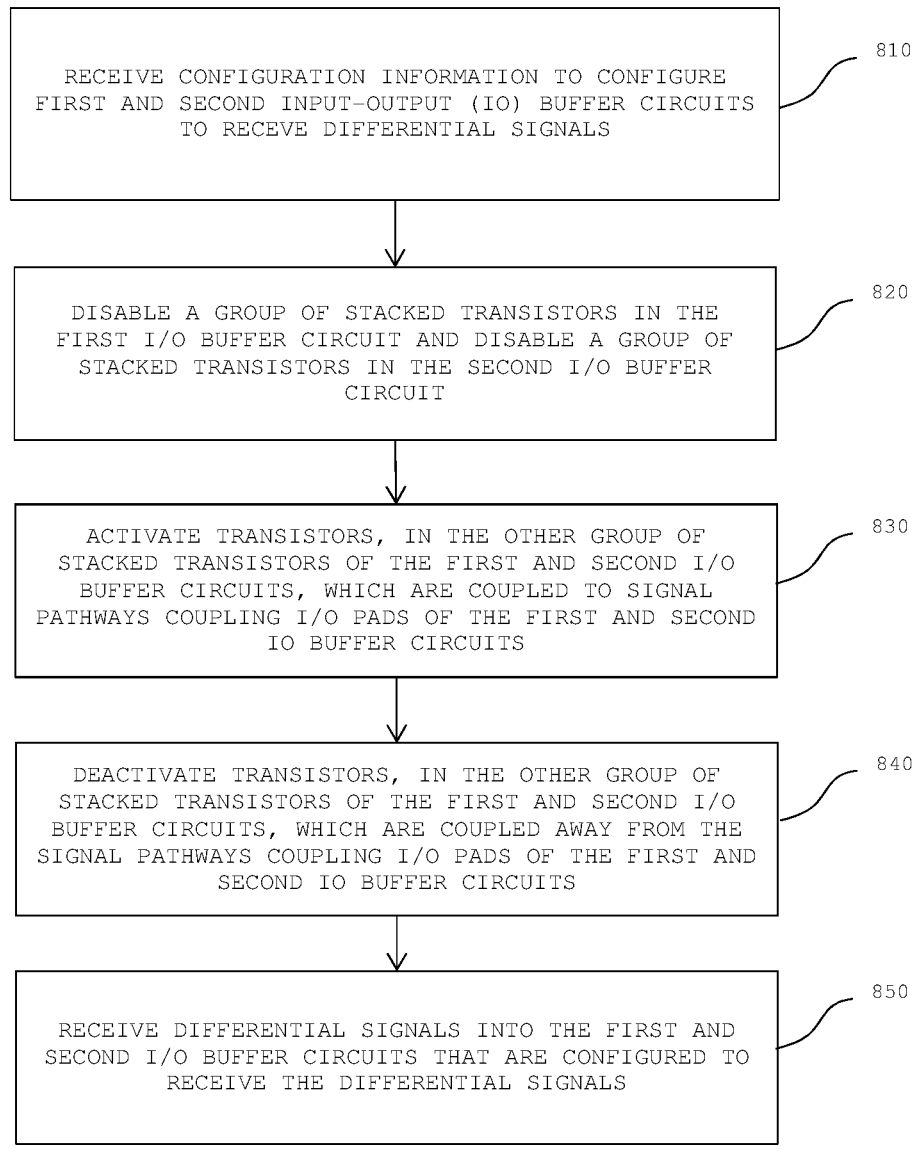
FIG. 8 shows an illustrative flowchart of a method to configure two input/output (I/O) buffer circuits to receive LVDS protocol based signals using an integrated circuit device in accordance with an embodiment.

FIG. 8, meant to be illustrative but not limiting, illustrates a method of configuring two input/output (I/O) buffer circuits of an integrated circuit device to receive LVDS signal in accordance with one embodiment of the present invention. As described in FIGS. 5, 6 and 7, the first and second I/O buffer circuits may be similar to I/O buffer circuits 330A and 330B of FIG. 3 or I/O buffer circuits 430A and 430B of FIG. 4. Each I/O buffer circuit may include two groups of stacked transistors, and hence in total there may be four groups of stacked transistors for two I/O buffer circuits, which may be referred to as first, second, third and fourth groups of stacked transistors.

At step 810, configuration information to configure first and second I/O buffer to receive LVDS signals in accordance to a LVDS protocol is received.

At step 820, a group of stacked transistors in the first I/O buffer circuit are deactivated. Furthermore, a group of stacked transistors in the second I/O buffer circuit are deactivated. In one embodiment, the first and third groups of stacked transistors are deactivated. In one exemplary embodiment, transistors forming the group of stacked transistor in the first and second I/O buffer circuits that are deactivated may be transistors 311A-314A and 311B-314B of FIG. 3 or transistors 411A-414A and 411B-414B of FIG. 4.

At step 830, transistors in the other group of stacked transistors in the first I/O buffer circuit that are coupled to a signal pathway coupling an I/O pad of the first I/O buffer circuit are activated. In one embodiment, these transistors may be transistors 322A and 323A of FIG. 3 and transistors 422A and 423A of FIG. 4. In addition, at step 830, transistors in the other group of stacked transistors in the second I/O buffer circuit that are coupled to a signal pathway coupling an I/O pad of the second I/O buffer circuit are also activated. In one embodiment, these transistors may be transistors 322B and 323B of FIG. 3 and transistors 422B and 423B of FIG. 4.

At step 840, other transistors in the other group of stacked transistors in the first I/O buffer circuit that are coupled away from the signal pathway that is coupled to an I/O pad of the first I/O buffer circuit are deactivated. In one embodiment, these transistors may be transistors 321A and 324A of FIG. 3 and transistors 421A and 424A of FIG. 4. In addition, at step 840, other transistors in the other group of stacked transistors in the second I/O buffer circuit that are coupled away from the signal pathway that is coupled to the I/O pad of the second I/O buffer circuit are also deactivated. In one embodiment, these transistors may be transistors 321B and 324B of FIG. 3 and transistors 421B and 424B of FIG. 4.

At step 850, the LVDS signals may be received in to the integrated circuit device through the configured I/O buffer circuits. The DDR signals may be received through I/O pads (e.g., I/O pads 340A and 340B of FIG. 3 or I/O pads 440A and 440B of FIG. 4).

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the families of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit device, comprising:
a first input/output (I/O) buffer circuit transferring signals based on a given signal transmission protocol selected from a group of signal transmission protocols, wherein the first input/output buffer circuit comprises:
first and second groups of stacked transistors, wherein the first group of stacked transistors transfers signals formatted in accordance with a first signal transmission protocol from the group of signal transmission protocols, and the second group of stacked transistors transfers the signals formatted in accordance to a plurality of signal transmission protocols from the group of signal transmission protocols, wherein the first input/output buffer circuit transfers the signals formatted in accordance with the first signal transmission protocol by activating both the first and second groups of stacked transistors, and wherein the first input/output buffer circuit transfers the signals formatted in accordance with the second signal transmission protocol by activating only one of the first and second groups of stacked transistors and biasing a subset of the transistors in the selectively activated one of the first and second groups of stacked transistors at an intermediate voltage that is different from voltages applied to activate or deactivate transistors, wherein the group of signal transmission protocols includes a single ended signal transmission protocol and a differential signal transmission protocol.

2. The integrated circuit device as defined in claim 1, the integrated circuit device further comprising:
a second input/output buffer circuit configurable to transfer signals based on the given signal transmission protocol selected from the group of signal transmission protocols, wherein the second input/output buffer circuit comprises:
third and fourth groups of stacked transistors, wherein the third group of stacked transistors transfers the signals formatted in accordance to the first signal transmission protocol from the group of signal transmission protocols, and the fourth group of stacked transistors transfers the signals formatted in accordance to the plurality of signal transmission protocols from the group of signal transmission protocols.

3. The integrated circuit device as defined in claim 2, wherein each of the first, second, third and fourth groups of stacked transistors comprises:
two p-channel transistors that are coupled in series between a middle node and a power terminal; and
two n-channel transistors that are coupled in series between the middle node and a ground terminal, and wherein the two n-channel transistors are coupled in series with the two p-channel transistors.

4. The integrated circuit device as defined in claim 3, further comprising:
a first input/output pad, wherein, the middle nodes of the first and second groups of stacked transistors are both coupled to the first input/output pad;
a second input/output pad, wherein the middle nodes of the third and fourth stacked transistors are both coupled to the second input/output pad.

5. The integrated circuit device as defined in claim 4, wherein the first and second groups of stacked transistors are coupled in parallel, and wherein the third and fourth groups of stacked transistors are coupled in parallel.

6. The integrated circuit device as defined in claim 5, wherein the first and second input/output buffers are selected from a group of circuits consisting of: current mode LVDS protocol circuits and voltage mode LVDS protocol circuits.

7. An integrated circuit device, comprising:
a first input/output (I/O) buffer circuit that transfers signals in accordance to a given signal transmission protocol selected from first and second signal transmission protocols; and
a second input/output (I/O) buffer circuit that transfer signals in accordance to the given signal transmission protocol, wherein a first subset of transistors in the second I/O buffer circuit is deactivated by biasing the first subset of transistors with a first voltage when the second I/O buffer circuit transfers signals in accordance to the given signal transmission protocol, wherein a second subset of transistors in the second I/O buffer circuit is activated by biasing the second subset of transistors with a second voltage when the second I/O buffer circuit transfers signals in accordance to the given signal transmission protocol, and wherein a third subset of transistors in the second I/O buffer circuit is biased at an intermediate voltage that is between the first and second voltages; and
interconnections coupled to the first and second I/O buffer circuits, wherein the signal interconnections are disabled when the first and second I/O buffer circuits are configured to receive signals according to either the first or second signal transmission protocols.

8. The integrated circuit device as defined in claim 7, further comprising:
a node stabilization circuit that is coupled to one of the interconnections, wherein the node stabilization circuit stabilizes a voltage level of the one of the interconnections.

9. The integrated circuit device as defined in claim 8, further comprising:
a current source that is coupled to one of the interconnections, wherein the current source comprises a p-channel transistor.

10. The integrated circuit device as defined in claim 7, further comprising:
a first pass gate transistor that comprises a p-channel transistor that is coupled in series to a first interconnection of the interconnections; and
a second pass gate transistor that comprises an n-channel transistor that is coupled in series to a second interconnection of the interconnections.

11. The integrated circuit device as defined in claim 7, wherein the first signal transmission protocol is a double data rate (DDR) signal transmission protocol and the second signal transmission protocol is a low voltage differential signal (LVDS) protocol.

12. The integrated circuit device as defined in claim 7, wherein the first input/output buffer circuit comprises:
two groups of stacked transistors that are formed in parallel to each other, wherein each of the two groups of stacked transistors comprises a pull-up circuit coupled in series to a pull-down circuit;
an input/output pad that is coupled to a node between the pull-up circuit and the pull-down circuit of each of the two groups of stacked transistors.

13. The integrated circuit device as defined in claim 12, wherein the second input/output buffer circuit comprises:
two groups of stacked transistors that are formed parallel to each other, wherein each of the two groups of stacked transistors comprises a pull-up circuit coupled in series to a pull-down circuit;
another input/output pad that is coupled to a node between the pull-up circuit and the pull-down circuit of each of the two groups of stacked transistors.

14. A method of operating an integrated circuit device that comprises first, second, third and fourth groups of stacked transistors, wherein the method comprises:
receiving configuration information for the first, second, third and fourth groups of stacked transistors; and
configuring the first, second, third and fourth stacked transistors using the received configuration information to transfer signals in accordance to a selected signal transmission protocol from a group of first and second signal transmission protocols, wherein transmitting signals according to the first signal transmission protocol comprises activating the first, second, third, and fourth groups of stacked transistors, and wherein transmitting signals according to the second signal transmission protocol comprises activating only the first and third groups of stacked transistors by biasing a first transistor in the first group of stacked transistors at a first voltage, biasing a second transistor in the first group of stacked transistors at an second voltage that is less than the first voltage, and biasing a third transistor in the second group of stacked transistors at a third voltage, wherein the first signal transmission protocol is a double data rate signal transmission protocol and the second signal transmission protocol is a low voltage differential single (LVDS) protocol.

15. The method as defined in claim 14, wherein the first, second, third and fourth groups of stacked transistors are configured to transmit signals in accordance to the first signal transmission protocol, the method further comprising:
   activating the first, second, third and fourth group of stacked transistors;
   transmitting a signal formatted in accordance with the first signal transmission protocol from a pad that is coupled to the first and second groups of stacked transistors; and
   transmitting another signal formatted in accordance with the first signal transmission protocol from another pad that is coupled to the third and fourth groups of stacked transistors.

16. The method as defined in claim 14, wherein the first, second, third and fourth groups of stacked transistors are configured to receive signals according to the first signal transmission protocol, the method further comprising:
   activating the first and third groups of stacked transistors;
   disabling the second and fourth groups of stacked transistors; and
   receiving a signal formatted in accordance with the first signal transmission protocol from a pad that is coupled to the first and second groups of stacked transistors.

17. The method as defined in claim 14, wherein the first, second, third and fourth groups of stacked transistors are configured to transmit signals formatted in accordance with the second signal transmission protocol, the method further comprising:
   disabling the second and fourth groups of stacked transistors;
   biasing the first and third groups of stacked transistors;
   transmitting a first signal formatted in accordance to the second signal transmission protocol out from a pad that is coupled to the first and second groups of stacked transistors; and
   transmitting a second signal formatted in accordance with the second signal transmission protocol and that is complement to the first signal from another pad that is coupled to the third and fourth groups of stacked transistors.

18. The method as defined in claim 14, wherein the first, second, third and fourth groups of stacked transistors are configured to receive signals out according to the second signal transmission protocol, the method comprising:
   disabling the second and fourth groups of stacked transistors; and
   activating transistors within the first group of stacked transistors that are coupled to a pad of the first and second group of stacked transistors; and
   activating transistors within the third group of stacked transistors that are coupled to a pad of the third and fourth group of stacked transistors.

19. The method as defined in claim 14, wherein the first, second, third and fourth groups of stacked transistors are configured in accordance to the first signal transmission protocol, the method further comprising:
   receiving another configuration information that comprises configuration information for the first, second, third and fourth groups of stacked transistors to transfer signals formatted in accordance with the second signal transmission protocol; and
   configuring first, second, third and fourth groups of stacked transistors using the received configuration information to transfer signals formatted in accordance with to the second signal transmission protocol.

* * * * *